(12) United States Patent
Park et al.

(10) Patent No.: US 7,529,138 B2
(45) Date of Patent: May 5, 2009

(54) FLASH MEMORY DEVICES, METHODS OF ERASING FLASH MEMORY DEVICES AND MEMORY SYSTEMS INCLUDING THE SAME

(75) Inventors: Ki-Tae Park, Seongnam-si (KR); Jung-Dal Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 214 days.

(21) Appl. No.: 11/704,343

(22) Filed: Feb. 9, 2007

(65) Prior Publication Data

US 2007/0195610 A1 Aug. 23, 2007

(30) Foreign Application Priority Data

Feb. 22, 2006 (KR) .................. 10-2006-0017275

(51) Int. Cl.
*G11C 11/34* (2006.01)
(52) U.S. Cl. ............... 365/185.29; 365/185.17; 365/185.22; 365/189.07
(58) Field of Classification Search ............ 365/185.29, 365/185.17, 185.22, 189.07
See application file for complete search history.

(56) References Cited

U.S. PATENT DOCUMENTS

| | | | |
|---|---|---|---|
| 5,654,921 A | 8/1997 | Sano | |
| 5,962,888 A | 10/1999 | Kim | |
| 6,009,014 A | 12/1999 | Hollmer | |
| 6,862,217 B2 * | 3/2005 | Kawabata | ............... 365/185.18 |
| 7,161,835 B2 * | 1/2007 | Shiga | ..................... 365/185.22 |
| 7,447,081 B2 * | 11/2008 | Chan | ..................... 365/185.22 |
| 2005/0248993 A1 | 11/2005 | Lee et al. | |
| 2007/0014156 A1 * | 1/2007 | Li et al. | .................. 365/185.17 |
| 2007/0230250 A1 * | 10/2007 | Chan | ..................... 365/185.22 |
| 2007/0230253 A1 * | 10/2007 | Kim | ..................... 365/185.29 |
| 2008/0094911 A1 * | 4/2008 | Chan | ..................... 365/185.22 |
| 2008/0285355 A1 * | 11/2008 | Lee | ........................ 365/185.33 |

FOREIGN PATENT DOCUMENTS

| | | |
|---|---|---|
| JP | 08-227589 | 9/1996 |
| JP | 10-125081 | 5/1998 |
| KR | 1020050107088 A | 11/2005 |

* cited by examiner

*Primary Examiner*—Tuan T. Nguyen
(74) *Attorney, Agent, or Firm*—Harness, Dickey & Pierce, P.L.C.

(57) ABSTRACT

In a method of erasing a non-volatile memory device an electric field is applied between a plurality of word lines and a substrate to erase memory cells in a memory block simultaneously. After a first time period elapses, the electric field applied between a first portion of the plurality of word lines and the substrate is maintained to erase memory cells, while the electric field between a second portion of the plurality of word lines and the substrate is removed or reduced.

20 Claims, 12 Drawing Sheets

FLASH MEMORY DEVICES, METHODS OF ERASING FLASH MEMORY DEVICES AND MEMORY SYSTEMS INCLUDING THE SAME

PRIORITY STATEMENT

This non-provisional U.S. patent application claims priority under 35 U.S.C § 119 to Korean Patent Application 2006-17275 filed on Feb. 22, 2006, the entire contents of which are incorporated herein by reference.

BACKGROUND

Conventional semiconductor memory devices are classified as volatile or non-volatile memory devices. Volatile memory devices include memory devices such as DRAM, SRAM and the like. Non-volatile memory devices include memory devices such as PROM, EPROM, EEPROM, MRAM, FRAM, flash EEPROM, etc. A volatile memory devices loses stored data at power-off, whereas a non-volatile memory device retains stored data even without power. Flash memory devices such as EEPROM (electronically erasable and programmable read only memory) may be used as a storage medium in various applications and devices (such as computer systems), in which there is a possibility that power is interrupted. Flash memory devices may have relatively fast programming speeds and/or lower power consumption. Conventional flash memory devices such as NAND flash memory devices may also have a relatively high level of integration.

A conventional NAND flash memory device includes EEPROM memory cells referred to as flash EEPROM cells or flash memory cells. A conventional flash memory cell includes a cell transistor, which has a semiconductor substrate (or bulk), source and drain regions spaced apart from each other, a floating gate arranged on a channel region between the source and drain regions and storing electrons, and a control gate arranged on the floating gate. An example array of a conventional NAND flash memory device including such cell transistors is illustrated in FIG. 1. The conventional array of FIG. 1 includes a plurality of cell strings (or NAND strings), each of which may be configured in the same manner.

Referring to FIG. 1, a cell string includes a string select transistor SST as a first select transistor, a ground select transistor GST as a second select transistor and a plurality of (e.g., 32) memory cells MC0-MC31 connected in series between the select transistors SST and GST. In each cell string, the string select transistor SST has a drain connected to a corresponding bit line and a gate connected to a string select line SSL. The ground select transistor GST has a source connected to a common source line CSL and a gate connected to a ground select line GSL. The memory cells MC0-MC31 are serially connected between a drain of the ground select transistor GST and a source of the string select transistor SST. Gates of each of memory cells MC0-MC31 are connected to a corresponding one of word lines WL0-WL31.

A group of cell strings such as those illustrated in FIG. 1 is also referred to as a memory block. In a conventional NAND flash memory device, program and read operations are made by page unit, and erase operations are carried out per block unit. Conventionally, prior to a program operation, memory cells may be erased and set to a threshold voltage lower than 0V.

FIG. 2 illustrates a conventional erase method. As shown, the conventional erase method may include performing an erase operation (S10) and performing an erase verify operation (S20). At S10, all memory cells in a memory block are erased simultaneously. For example, as illustrated in FIG. 3, memory cells are simultaneously erased by driving word lines WL0-WL31 in a memory block with a voltage of 0V and a substrate (or a bulk) with an erase voltage Verase (e.g., 19V). At this time, the string and ground select lines SSL and GSL are floating. With this bias condition, electrons are discharged from a floating gate into the substrate (or bulk). At S20, whether threshold voltages of erased memory cells are lower than a target threshold voltage is verified. For example, as illustrated in FIG. 4, a sense current is supplied to bit lines from a page buffer circuit (not shown). For example, a voltage of 0V is applied to word lines WL0-WL31 in a memory block, and a read voltage Vread is applied to the string and ground select lines SSL and GSL. With this bias condition, when threshold voltages of all memory cells reach a target threshold voltage or lower than the target threshold voltage, the sense current supplied to the bit lines is discharged to a common source line CSL through a cell string. In the event that a threshold voltage of at least memory cell does not reach the target threshold voltage, the sense current is not discharged to the common source line through a cell string.

After applying the sense current, an erase pass/fail may be determined by sensing a potential on respective bit lines. When the result indicates erase fail, the S10 and S20 may be repeated until the result indicates an erase pass.

The above-described conventional erase verify method is disclosed in U.S. Pat. No. 6,009,014 entitled "ERASE VERIFY SCHEME FOR NAND FLASH," the entire contents of which are incorporated herein by reference.

Improving the degree of integration of conventional NAND flash memory devices may decrease the space between signal lines such as word lines, a string select line and/or a ground select line. The decrease in space between word lines may be proportional to the improvement in the degree of integration, while the decrease in space between a select line(s) and an adjacent word line may not be proportional to the improving degree of integration. For example, as illustrated in FIG. 5, a space S2 between a string select line SSL and an adjacent word line WL31 is wider than the space S1 between word lines WL0 and WL1 due to program disturbance. When a relatively high voltage is applied to word line WL31 (e.g., during a program operation), a voltage of the string select line SSL may increase. This may cause a string select transistor in a string including a program-inhibited cell to turn-on and a channel voltage of the program-inhibited cell may be discharged to a bit line via the turned-on string select transistor. For at least this reason, reducing the space S2 between a select line SSL and word line WL31 to be the same or substantially the same as the space S1 between word lines may be relatively difficult.

Still referring to FIG. 5, for example, if the spaces S1 and S2 are different from each other, a source/drain junction resistance of a memory cell transistor in respective word lines WL0 and WL31 may be changed. A halo process in which a p-type impurity region is formed below n-type source and drains of each cell transistor may be used to reduce short channel occurrences caused by improving the degree of integration. This p-type impurity region, as illustrated in FIG. 6, may be formed by injecting boron ions in a substrate at an angle of 7° to 8°. Because the space S2 is wider than the space S1, boron may be injected at source/drain junctions placed between a string select line SSL and word line WL31 and between a ground select line GSL and word line WL0. This may vary the source/drain resistance according to a variation of a voltage (e.g., 0V or a read voltage) applied to word line WL0/WL31. Accordingly, a cell current flowing via a memory cell connected to the word line WL0/WL31 may vary according to a voltage variation (e.g., 0V or a read voltage) applied to word line WL0/WL31.

In addition, in the above-described conventional structure, threshold voltages of erased memory cells are distributed more widely. In this example, when an erase operation is performed, a voltage of 0V is applied to word lines WL0-WL31 and an erase voltage Verase is applied to a substrate (or bulk). Because string and ground select lines SSL and GSL are floating, when the erase voltage Verase is applied to the substrate (or bulk), voltages of the lines SSL and GSL are boosted. As a result, potentials of floating gates connected to the word lines WL0 and WL31 may be higher than those of memory cells connected to remaining word lines WL1-WL30 due to the voltage increase of the select lines SSL and GSL.

As illustrated in FIG. 7, for example, in the case of a memory cell in word line WL1, a potential of a floating gate (marked by FG(WL1)) of a memory cell may be determined based on coupling capacitances C1, C2 and C3 between word lines WL0, WL1 and WL2 and the floating gate FG(WL1) and a coupling capacitance C4 between a substrate and the floating gate FG(WL1). Although not shown, a specific voltage may be induced in the same manner at a floating gate of a memory cell connected to respective word lines WL2-WL30. On the other hand, in the case of a memory cell in word line WL0, a potential of a floating gate (marked by FG(WL0)) of a memory cell may be determined based on coupling capacitances C11, C12 and C13 between select and word lines GSL, WL0 and WL1 and the floating gate FG(WL0) and a coupling capacitance C14 between a substrate and the floating gate FG(WL0). Although not shown, a specific voltage may be induced in the same manner at a floating gate of a memory cell connected to a word line WL31.

Herein, in case of a conventional NAND flash memory device, a substrate where memory cells are formed may include a pocket p-well, which is formed within a deep n-well formed at a p-type substrate. Such a triple well structure is disclosed in U.S. Pat. No. 5,962,888 entitled "WELL STRUCTURE NON-VOLATILE MEMORY DEVICE AND METHOD FOR FABRICATING THE SAME," the entire contents of which are incorporated herein by reference.

As voltages of the string and ground select lines SSL and GSL are boosted, voltages of floating gates of memory cells connected to word lines WL0 and WL31 may increase due to boosted voltages of the string and ground select lines SSL and GSL. As a result, an electric field generated between a substrate and floating gates of memory cells connected to word lines WL0 and WL31 may decrease. Due to the reduction of electric field between a substrate and floating gates, an erase speed of memory cells connected to word lines WL0 and WL31 may become slower than that of memory cells connected to remaining word lines WL1-WL30. As a result, as illustrated in FIG. 8, in conventional NAND flash memory devices, threshold voltages of erased memory cells are more widely distributed due to memory cells connected to word lines WL0 and WL31. If a threshold voltage distribution of erased memory cells is widened due to memory cells connected to word lines WL0 and WL31, as illustrated in FIG. 8, a threshold voltage distribution of programmed memory cells is also widened. Further, memory cells connected to the word lines WL0 and WL31 may cause an increase in an erase loop number, which may increase erase time. This may result in erase fails in memory cells.

SUMMARY

Example embodiments relate to non-volatile memory devices, for example, flash memory devices and methods of erasing flash memory devices.

In at least one example embodiment, a method of erasing a non-volatile memory device is provided. The method may include simultaneously erasing memory cells in a memory block by applying an electric field between word lines and a substrate for a first time period, and maintaining, after the first time period, the electric field applied between a part of the word lines and the substrate to erase memory cells, while reducing or removing the electric field between remaining word lines and the substrate.

At least one other example embodiment provides a method of erasing a non-volatile memory device. The method may include driving word lines with a ground voltage and a well with an erase voltage to erase memory cells in a memory block simultaneously, with string and ground select lines being floated. After a first time period elapses, driving word lines adjacent to the string and ground select lines, while floating remaining word lines.

At least one other example embodiment provides a memory system. The memory system may include a NAND flash memory device having a status register, and a memory controller configured to control an erase operation of the NAND flash memory device. After an erase operation of the NAND flash memory device is complete, the memory controller may output a command for a verify read operation to the NAND flash memory device when status information in the status register indicates an erase fail, and the NAND flash memory device may respond to the command and determine whether the erase fail is due to memory cells to word lines adjacent to respective string and ground select lines.

At least one other example embodiment provides a method of erasing a non-volatile memory device. According to at least this method, an electric field may be simultaneously applied between each of a plurality of word lines and a substrate for a first time period. Each of the plurality of word lines may be connected to at least one memory cell of a memory block. After the first time period, the electric field applied between each word line in a first portion of the plurality of word lines and the substrate may be maintained to erase a corresponding first portion of memory cells, while the electric field between each word line in a second portion of the plurality of word lines and the substrate is reduced or removed.

According to at least some example embodiments, at least during the maintaining and the reducing, a string select line and a ground select line may be floated. The first portion of the plurality of word lines may include a first word line adjacent to a string select line and a second word line adjacent to a ground select line. The non-volatile memory device may be a NAND flash memory device and/or the substrate may have a triple well structure. The electric field between the second portion of the plurality of word lines and the substrate may be removed by setting the second portion of the plurality of word lines to a floating state to prohibit erasing of memory cells connected to the second portion of the plurality of word lines. The electric field between the second portion of the plurality of word lines and the substrate may be reduced by driving the second portion of the plurality of word lines with a voltage greater than or equal to a power supply voltage to prohibit erasing of memory cells connected to the second portion of the plurality of word lines.

According to at least some example embodiments, the simultaneously applying may include driving the plurality of word lines with a ground voltage, and driving the substrate with an erase voltage.

At least one other example embodiment provides a method of erasing a non-volatile memory device. According to at least this method, a plurality of word lines may be driven with a ground voltage and a well of a substrate may be driven with an erase voltage, while a string select line and a ground select line are floated. Each of the plurality of word lines may be connected to at least one of a plurality of memory cells in a memory block. After a first time period, the driving of a first portion of the plurality of word lines may be maintained. The first portion of the plurality of word lines may include a first word line adjacent to the string select line and a second word line adjacent to the ground select line. In addition, after the first time period, a second portion of the plurality of word lines may be floated.

According to at least some example embodiments, whether threshold voltages of memory cells connected to the plurality of word lines have reached a target threshold voltage may be determined, and the driving, maintaining and floating may be repeated if a threshold voltage of at least one of the memory cells is determined to be greater than the target threshold voltage. Alternatively, whether threshold voltages of memory cells connected to the plurality of word lines have reached a target threshold voltage may be determined, and the driving, maintaining, floating and determining may be repeated if a threshold voltage of at least one of the memory cells is determined to be greater than the target threshold voltage. The driving, maintaining, floating and determining are repeated until the threshold voltage of each of the memory cells is determined to be lower than the target threshold voltage.

At least one other example embodiment provides a method of erasing a flash memory device. According to at least this method, an erase loop operation including at least a first and a second erase loop may be repeated. The first erase loop may include driving a plurality of word lines with a ground voltage and a well of a substrate with an erase voltage, while a string select line and a ground select line are floated, and after a first time period, driving a first portion of the plurality of word lines with the ground voltage, while a remaining portion of the word lines are floated. The first portion of the plurality of word lines may include a first word line adjacent to the string select line and a second word line adjacent to the ground select line. The second erase loop may include driving the first portion of the plurality of word lines while the remaining portion of the word lines are floated. During an erase operation of each of the first and second erase loops, the string and ground select lines may be maintained at a floating state.

At least one other example embodiment provides a memory system. The system according to at least this example embodiment may include a flash memory device and a memory controller. The flash memory device may include a status register. The memory controller may be configured to control an erase operation of the flash memory device. After an erase operation of the flash memory device is complete, the memory controller may be configured to output a command for a verify read operation to the flash memory device when status information in the status register indicates an erase fail, and the flash memory device may be configured to respond to the command by determining whether the erase fail is due to memory cells corresponding to a first portion of a plurality of word lines. The first portion may include a first word line adjacent to a string select line and a second word line adjacent to a ground select line.

According to at least some example embodiments, the flash memory device may be further configured to perform a first verify read operation and a second verify read operation, successively, in response to the received command, to determine whether the erase fail is due to memory cells corresponding to the first portion of the plurality of word lines. The first verify read operation may include driving the first portion of the plurality of word lines with a read voltage and driving a remaining portion of the word lines with a ground voltage. The second verify read operation may include driving the first portion of the plurality of word lines with the ground voltage, and driving a remaining word lines with a read voltage. Result values of the first and second verify read operations may be stored in the status register. If the result values in the status register indicate that the erase fail is due to memory cells corresponding to the first portion of the plurality of word lines, the memory controller may be configured to control the flash memory device to perform an erase operation with respect to memory cells corresponding to the first portion of the plurality of word lines. During the erase operation with respect to the memory cells corresponding to the first portion of the plurality of word lines, the first portion of the plurality of word lines may be driven with the ground voltage and a remaining word lines may be maintained at a floating state.

At least one other example embodiment provides a method for erasing a flash memory device. According to at least this method, an erase voltage may be generated in response to an erase command. For a first time period, a plurality of word lines may be driven with a ground voltage and a well of a substrate may be driven with an erase voltage, while string and ground select lines may be floated. After the first time period elapses, a first portion of the plurality of word lines may be driven with the ground voltage and a second portion of the plurality of word lines may be driven with a voltage greater than or equal to a power supply voltage. The first portion of the plurality of word lines may include a first word line adjacent to the string select line and a second word line adjacent to the ground select line. Whether threshold voltages of the memory cells have reached a target threshold voltage may be determined, and at least the driving during the first time period, the driving after the first time period and the determining a number of times until the threshold voltage of each of the memory cells is lower than the target threshold voltage if a threshold voltage of at least one of the memory cells is determined to be greater than the target threshold voltage.

DETAILED DESCRIPTION OF EXAMPLE EMBODIMENTS

Figure 1:
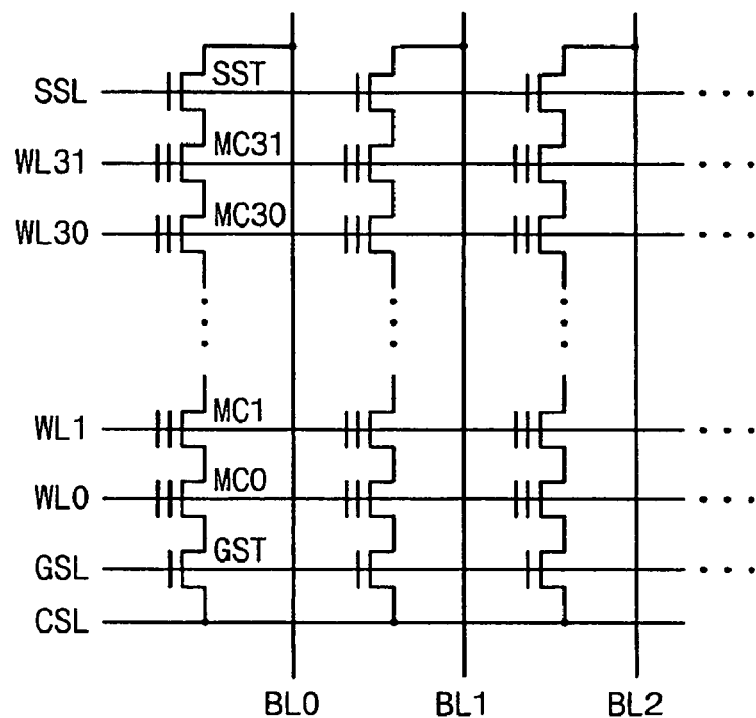
FIG. 1 is a diagram showing an array structure of a conventional NAND flash memory device.
Figure 2:
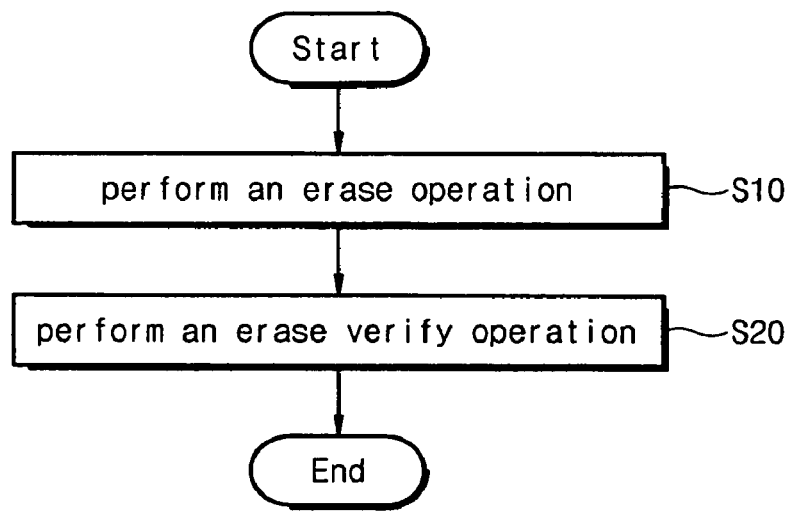
FIG. 2 is a flowchart for describing a conventional erase method.
Figure 3:
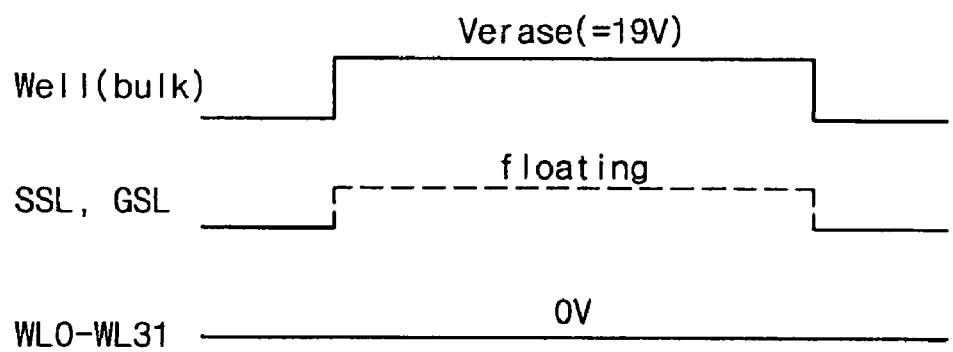
FIG. 3 is a diagram showing a bias condition of a conventional erase operation.
Figure 4:
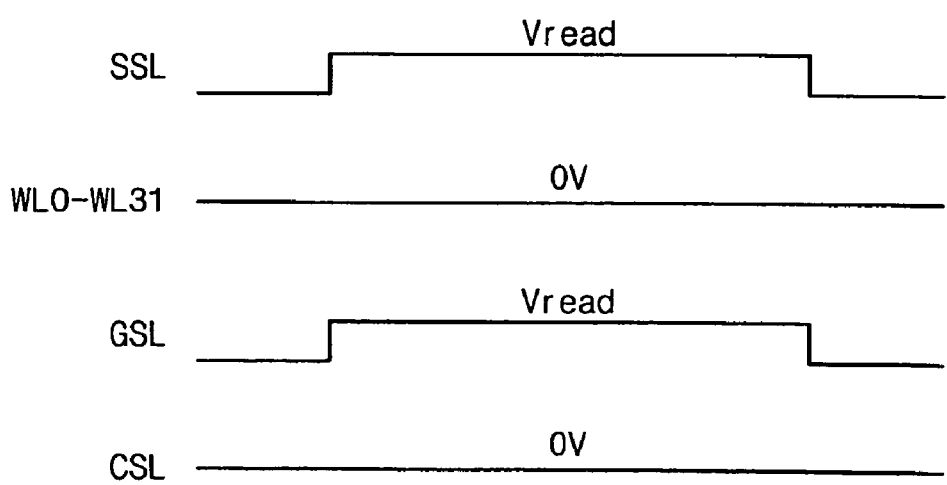
FIG. 4 is a diagram showing a bias condition of a conventional erase verify operation.
Figure 5:
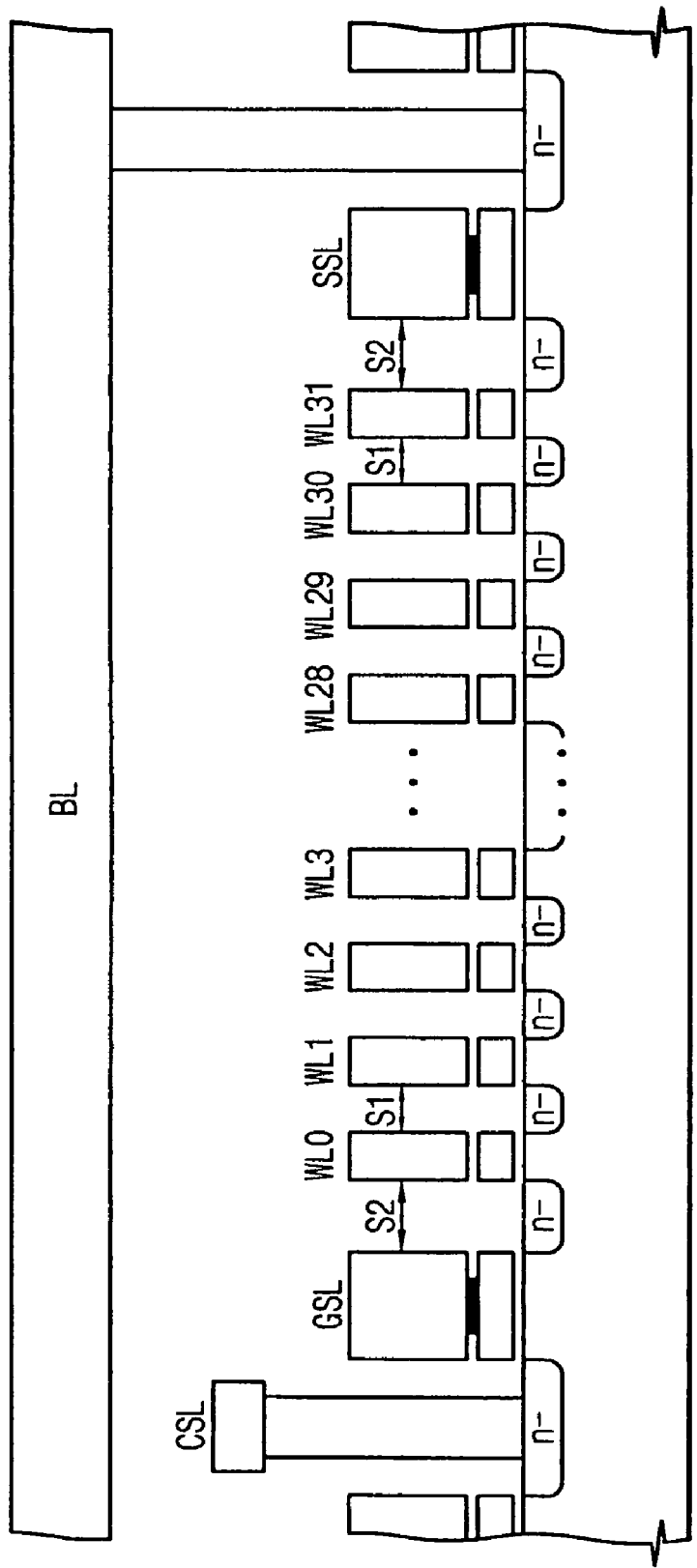
FIG. 5 is a cross-sectional view showing a conventional cell string structure corresponding to the array structure of the conventional NAND flash memory device shown in FIG. 1.
Figure 6:
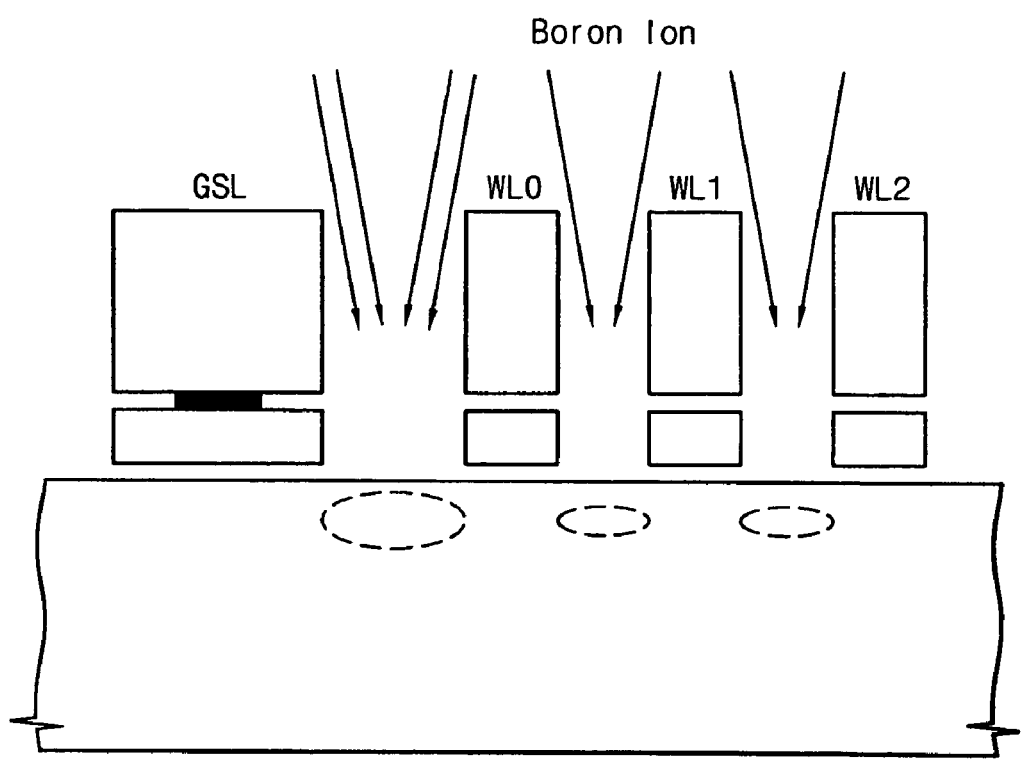
FIG. 6 is a diagram for describing a conventional halo process.
Figure 7:
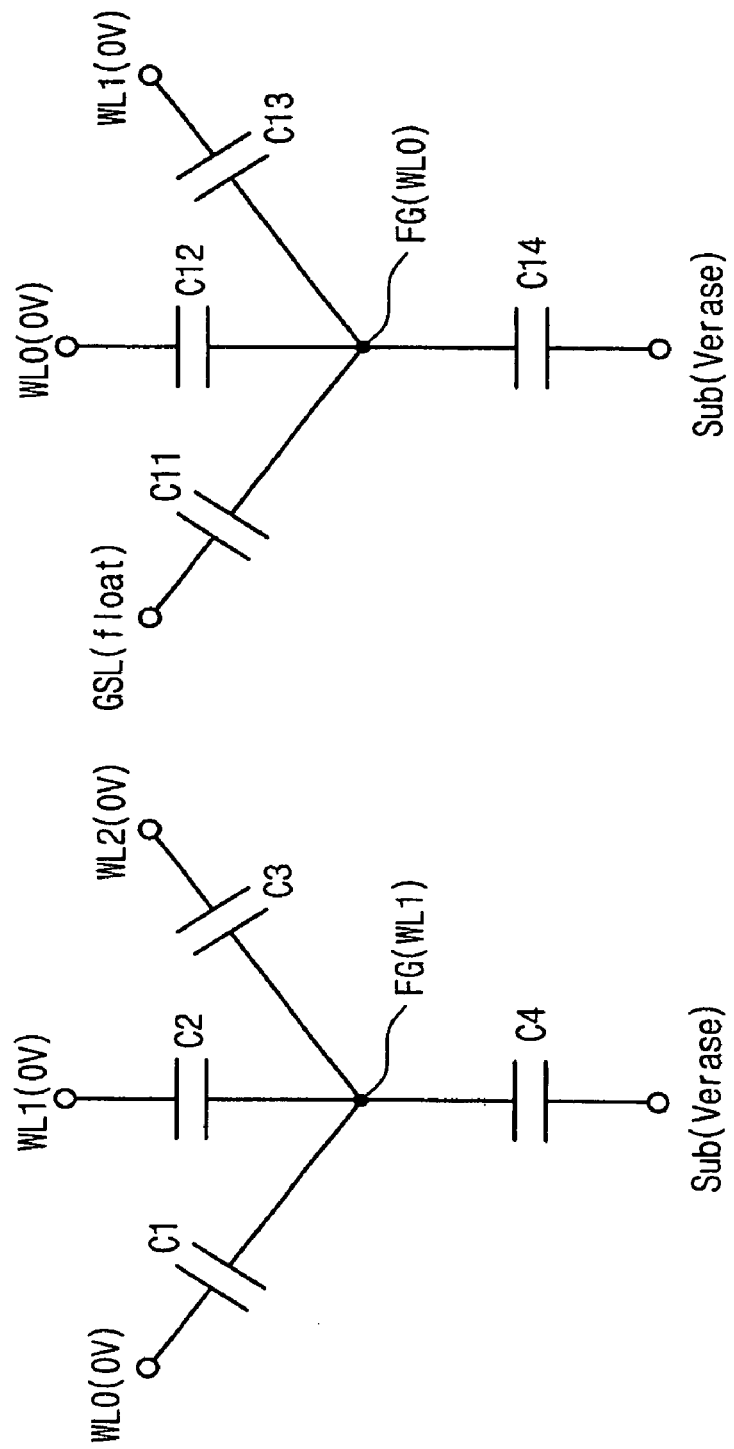
FIG. 7 is a diagram for describing a voltage induced at floating gates of memory cells connected to word lines during a conventional erase operation.
Figure 8:
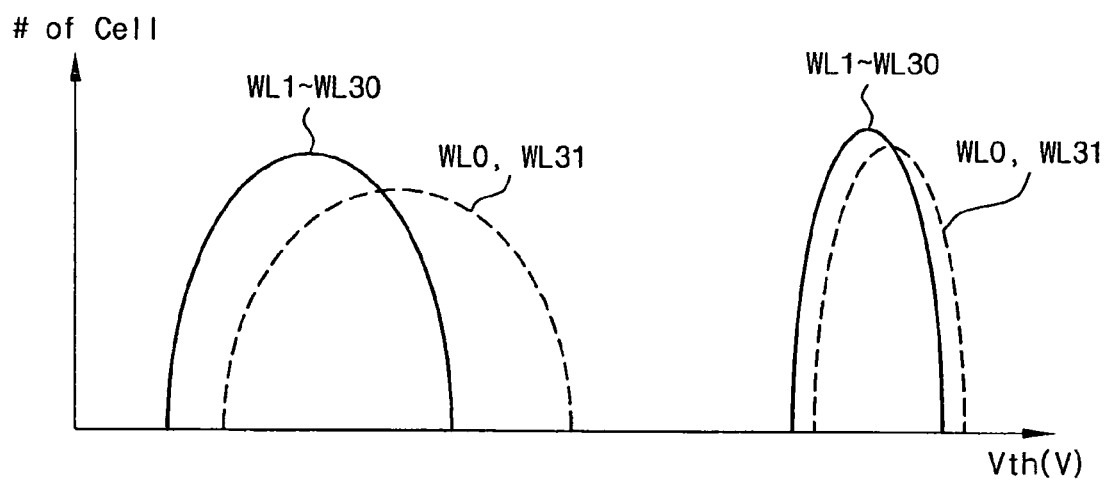
FIG. 8 is diagram for describing widening of a threshold voltage distribution due to memory cells in word lines adjacent to selected word lines according to the conventional art.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 9:
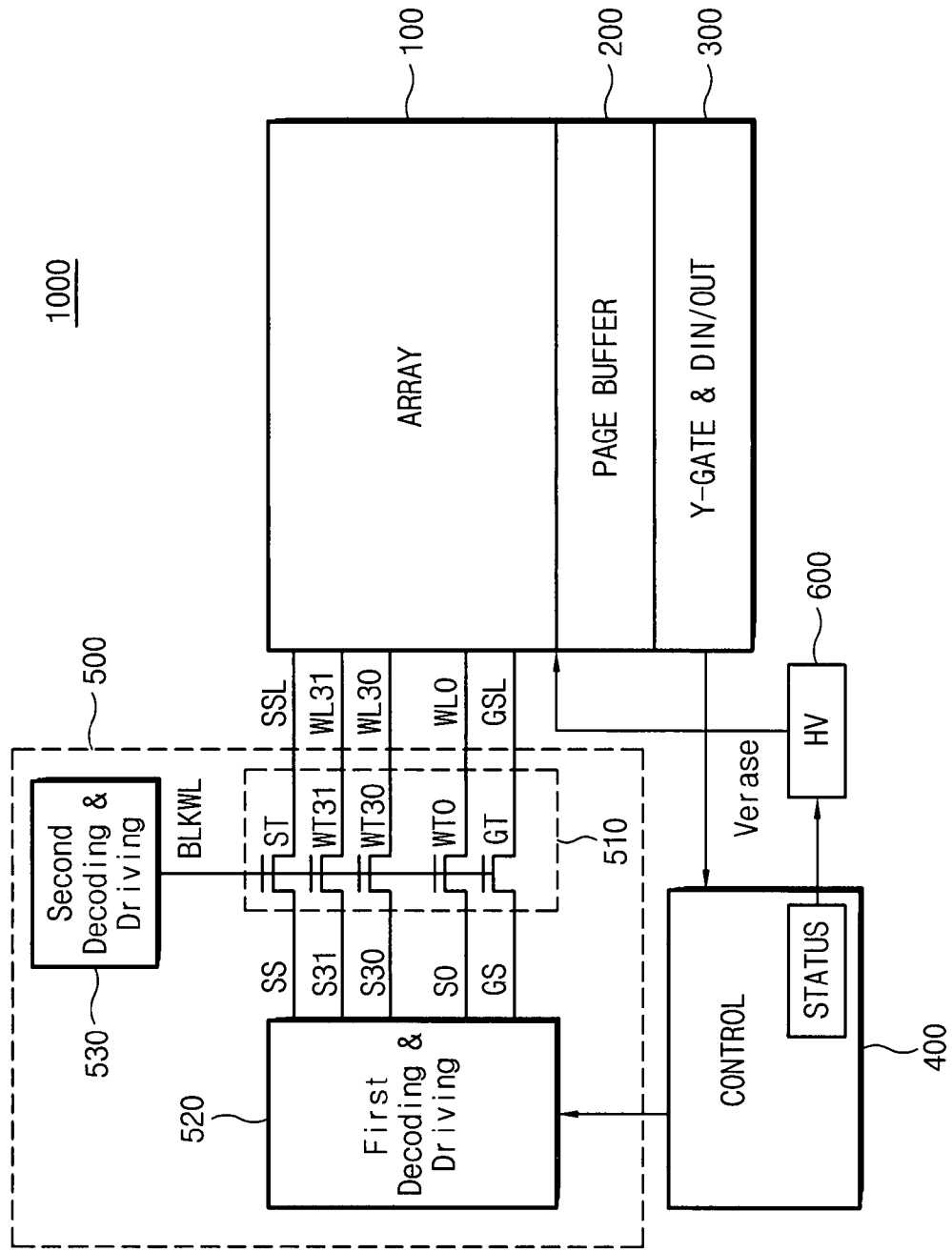
FIG. 9 is a block diagram showing a NAND flash memory device according to an example embodiment.

FIG. 9 is a block diagram showing a NAND flash memory device according to an example embodiment.

Referring to FIG. 9, a NAND flash memory device 1000 may include a memory cell array 100. The memory cell array 100 may include a plurality of memory blocks storing data information. The memory cell array 100 in FIG. 9 may correspond to one memory block, which may be configured in the same or substantially the same manner as illustrated in FIG. 1. The NAND flash memory device 1000 may further include a page buffer circuit 200, which may operate as a write driver and/or a sense amplifier according to a mode of operation. For example, in a program operation, the page buffer circuit 200 may latch program data transferred via a column gate and data input/output circuit 300, and may drive bit lines with a program or non-program voltage based on the latched program data. In an example read operation including a verify read operation and a normal read operation, the page buffer circuit 200 may read out data (e.g., page data) from the memory cell array 100, while the column gate and data input/output circuit (Y-GATE & DIN/OUT) 300 output the read data to control logic 400 or to an external destination. For example, during the verify read operation, the column gate and data input/output circuit 300 may output the read data to the control logic 400. In the normal read operation, the column gate and data input/output circuit 300 may output the read data to an external destination.

The control logic 400 may be configured to control the operation (e.g., an entire operation) of the NAND flash memory device 1000. For example, the control logic 400 may determine (e.g., judge) whether an external command CMD is an erase command, a program command or a read command, and control operations of a memory device 1000 according to the determined command. During an erase/program verify operation, the control logic 400 may determine whether data bits transferred via the column gate and data output circuit 300 constitute pass data. The control logic 400 may continue to perform or stop an erase/program procedure based on the result. If the erase/program procedure is stopped, the control logic 400 may store pass/fail information in a status register 401. The pass/fail information stored in the status register 401 may be output to an external destination when a status read command is received.

Still referring to FIG. 9, the NAND flash memory device 1000 according to at least this example embodiment, may further include a row selector circuit 500. The row selector circuit 500 may be controlled by the control logic 400, and may drive the string select line SSL, the word lines WL0-WL31, and the gate select line GSL with appropriate voltages according to a mode of operation. The row selector circuit 500 may include a pass gate 510, a first decoding and driving block 520 and/or a second decoding and driving block 530.

The pass gate 510 may be configured to connect the string select line SSL, the gate select line GSL, and word lines WL0-WL31 to corresponding signal lines SS, GS, and S0-S31 in response to an activation of a block word line BLKWL. As illustrated in FIG. 9, the pass gate 510 may include a plurality of switch transistors ST, WT0-WT31 and GT. Gates of the switch transistors ST, WT0-WT31, and GT may be commonly connected to the block word line BLKWL. When the block word line BLKWL is active, the string select line SSL, the gate select line GSL, and word lines WL0-

WL31 are connected to corresponding signal lines SS, GS and S0-S31, respectively, via corresponding switch transistors ST, GT and WT0-WT31. The switch transistors ST, WT0-WT31 and GT may include a voltage transistor (e.g., a relatively high voltage transistor) capable of handling (e.g., tolerable against) a relatively high voltage VPP.

The first decoding and driving block 520 may be configured to drive the signal lines SS, GS and/or S0-S31 with appropriate voltages according to the control of the control logic 400. For example, in an erase operation, the first decoding and driving block 520 may drive the signal lines S0-S31 with a voltage of about 0V. At this time, the signal lines SS and GS may be floated. In an example erase verify read operation, the first decoding and driving block 520 may drive the signal lines S0-S31 with a voltage of about 0V and the signal lines SS and GS with a read voltage. The second decoding and driving block 530 may decode a block address and activate the block word line BLKWL based on the decoded result. A voltage of the active block word line BLKWL may have a voltage sufficient to transfer voltages of the signal lines S0-S31 to corresponding word lines WL0-WL31 with little or no voltage drop. A voltage generator circuit 600 may operate according to the control of the control logic 400 and may generate an erase voltage Verase to be supplied to a substrate (or bulk) of the memory cell array 100. The voltage generator circuit 600 may be implemented using a well-known charge pump or in any other suitable manner.

To increase an erase threshold voltage in NAND flash memory devices 1000 according to example embodiments, an erase time for memory cells connected to word lines WL0 and WL31 adjacent to the string and ground select lines SSL and GSL may be set longer than an erase time for memory cells connected to remaining word lines WL1-WL30. As will be described in more detail below, the erase time of memory cells connected to the word lines WL0 and WL31 may be controlled by various methods. An erase time of memory cells connected to the word lines WL0 and WL31 may be controlled by controlling an erase time for memory cells connected to word lines WL0 and WL31 adjacent to the string and ground select lines SSL and GSL. Accordingly, widening of an erase threshold voltage distribution due to memory cells connected to the word lines WL0 and WL31 may be suppressed and/or prevented.

In at least this example embodiment, the NAND flash memory device may have a triple well structure and a substrate where memory cells are formed.

Figure 10:
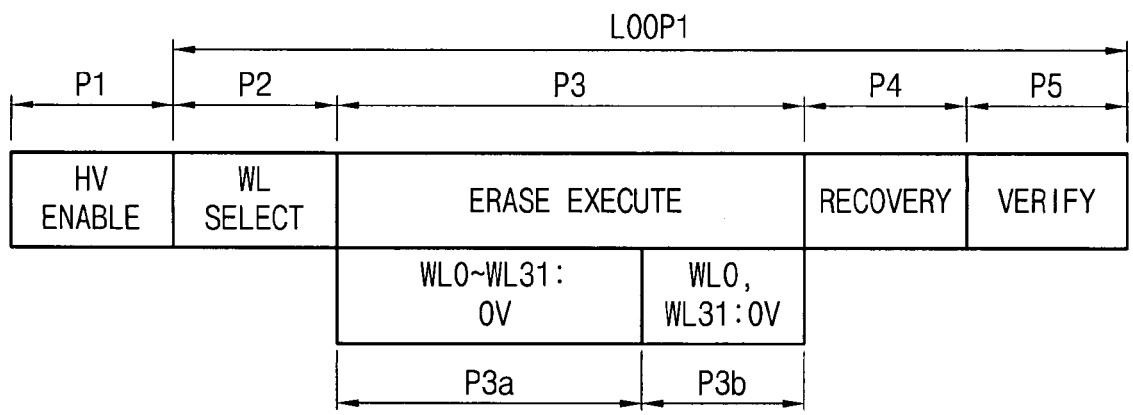
FIG. 10 is a diagram for describing an erase method according to an example embodiment.
Figure 11:
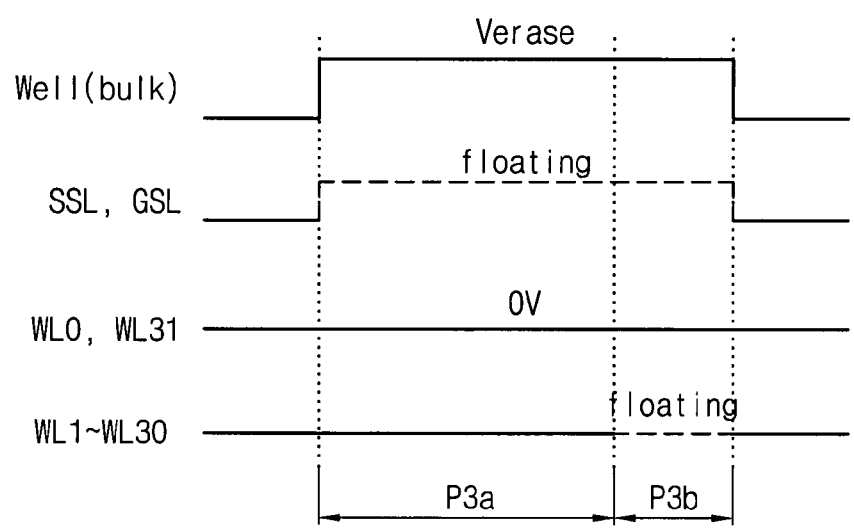
FIG. 11 is a diagram showing a bias condition of an erase operation according to an example embodiment.

FIG. 10 is a diagram describing a method of erasing a NAND flash memory device according to an example embodiment, and FIG. 11 is a diagram showing a bias condition of word lines WL0-WL31, string select line SSL and gate select line GSL according to the erase method shown in FIG. 10. Below, a method of erasing a NAND flash memory device according to an example embodiment will be described in detail with reference to the accompanying drawings. A block erase operation may be made according to a sequential input of an erase setup command (e.g., 60h), an address and/or an erase command (e.g., D0h). The block erase operation may be performed through a voltage setup period P1, a word line bias period P2, an erase execution period P3, a recovery period P4 and/or a verify read period P5. As discussed herein, the periods P2-P5 may constitute an erase loop, which may be repeated, for example, iteratively or a given number of times.

When an erase command is received, during the voltage setup period P1, voltage generator circuit 600 may generate an erase voltage Verase to be supplied to a substrate (or bulk) of a memory cell array 100 according to the control of control logic 400. During the word line bias period P2, a row selector circuit 500 may drive word lines WL0-WL31 with a voltage of about 0V based on the control of the control logic 400. String select line SSL and ground select line GSL may be floated. Because the string select line SSL is floated, strings of the memory cell array 100 may be isolated from corresponding bit lines. Likewise, because the ground select line GSL is floated, each string may be electrically isolated from a common source line CSL. After the word lines WL0-WL31 are driven with the voltage of about 0V, the erase voltage Verase from the voltage generator circuit 600 may be supplied to the substrate (or bulk) of the memory cell array 100. During the erase execution period P3, memory cells in a memory block may be erased concurrently or simultaneously under the bias conditions.

As illustrated in FIG. 10, the erase execution period P3 may include a first erase execution period P3a and/or a second erase execution period P3b. During the first erase execution period P3a, all or substantially all word lines WL0-WL31 may be driven with a voltage of about 0V via the row selector circuit 500 under the control of the control logic 400. In the second erase execution period P3b following the first erase execution period P3a, word lines WL1-WL30 may be floated, while word lines WL31 and WL0 adjacent to the string select line SSL and the gate select line GSL, respectively, may continue to be driven with the voltage of about 0V via the row selector circuit 500 under the control of the control logic 400. Because the word lines WL1-WL30 are floated during the second erase execution period P3b, memory cells connected to the word lines WL1-WL30 may not be erased. For example, memory cells connected to the word lines WL1-WL30 may be erase-inhibited. On the other hand, because the word lines WL0 and WL31 may be driven with about 0V during the second erase execution period P3b, the memory cells connected to the word lines WL0 and WL31 may be erased.

In other words, for example, during the first erase execution period P3a, an electric field may be applied between the word lines WL0-WL31 and the substrate so that memory cells in a memory block may be erased concurrently or simultaneously. During the second erase execution period P3b, an electric field between a part (e.g., WL0 and WL31) of the word lines WL0-WL31 and the substrate may be maintained while an electric field between the remaining word lines WL1-WL30 and the substrate is reduced or removed for suppressing, preventing and/or inhibiting erasure of memory cells connected to the word lines WL1-WL30.

In another example embodiment, during the first erase execution period P3b, to suppress, prevent and/or prohibit erasure, word lines WL1-WL30 may be driven with a power supply voltage or a voltage higher than the power supply voltage instead of a floating state.

During the recovery period P4, voltages applied to all or substantially all signal lines may be discharged. During the verify read period P5, a verify read operation for determining whether all memory cells are normally erased may be performed. The verify read operation may be performed in the same or substantially the same manner as described above, and description thereof is thus omitted for the sake of brevity. As a result of the verify read operation, data stored in a page buffer circuit 200 may be transferred to the control logic 400 via a column gate and data input/output circuit 300 in a given unit, and the control logic 400 may determine whether the transferred data bits are pass data bits.

For example, if at least one data bit is a fail data bit, the above-described erase loop P2-P5 may be repeated (e.g., a number of times) until all or all desired memory cells are erased. In the event that a fail data bit is detected until the erase loop is repeated a maximum number of times, the control logic 400 may store an erase fail data in a status register 401. If all data bits read by the page buffer circuit 200 are determined to be pass data bits, the control logic may store an erase pass data bit in the status register 401. Pass/fail data stored in the status register 401 may be output to an external destination, for example, to a memory controller (not shown) during a status read operation.

As set forth above, as voltages of the string select line SSL and the ground select line GSL are boosted, a voltage difference between a floating gate of each memory cell connected to the word lines WL0 and WL31 and the substrate may be reduced. This reduction of a voltage difference may reduce an erase speed of each memory cell connected to the word lines WL0 and WL31 as compared with that of each memory cell connected to the word lines WL1-WL30. However, the NAND flash memory device according to example embodiments may be constructed to erase memory cells connected to the word lines WL0 and WL31 during a period of time longer than that of each memory cell connected to the word lines WL1-WL30. For example, a reduction in erase speed of memory cells connected to word lines WL0 and WL31 may be compensated by increasing an erase time by the second erase execution period P3b. As the erase time is increased (e.g., by the second erase execution period P3b), memory cells connected to word lines WL0 and WL31 may be erased at a speed equal or substantially equal to memory cells connected to the remaining word lines WL1-WL30. Accordingly, it may be possible to suppress and/or prevent an erase threshold voltage distribution from being increased and/or widened due to memory cells connected to the word lines WL1-WL30.

Figure 12:
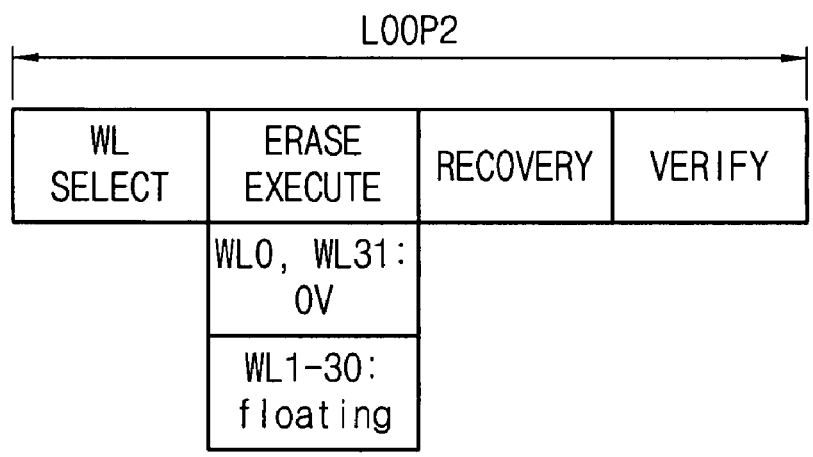
FIG. 12 is a diagram showing an erase loop according to another embodiment of an example embodiment.
Figure 13A:
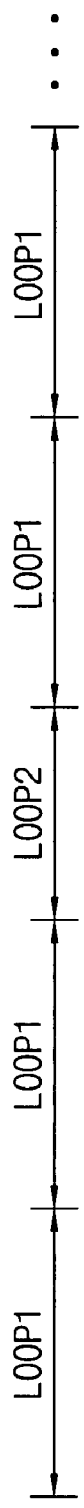
FIGS. 13A and 13B are diagrams for describing an erase method according to another example embodiment.
Figure 13B:
Figure 14:
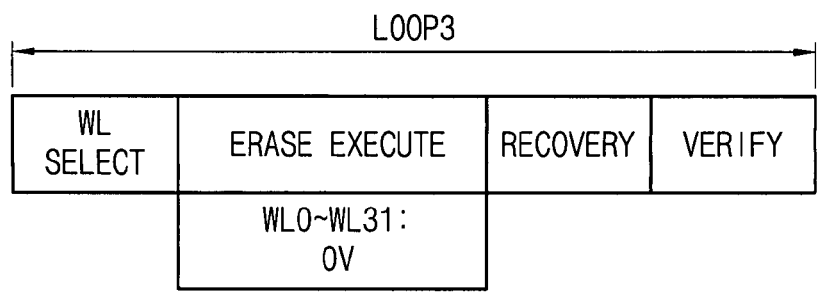
FIG. 14 is a diagram showing an erase loop according to another example embodiment.

In addition to the above-described example embodiment, erase methods according to example embodiments may be varied. For example, in at least some example embodiments, an additional erase loop having a bias condition different from that of the erase loop illustrated in FIG. 10 may be used. For example, an erase loop such as LOOP2 illustrated in FIG. 12 may be used. The erase loop LOOP2 in FIG. 12 is similar to the erase loop of FIG. 10 except that an erase execution period P3 includes only a second erase execution period P3b. Thus, during the second execution period P3b, word lines WL0 and WL31 are driven with a voltage of about 0V while the remaining word lines WL1-WL30 are floated. Although discussed separately, erase loops LOOP1 and LOOP2 may be combined. For example, as illustrated in FIG. 13A, an erase loop LOOP1 may be performed twice and an erase loop LOOP2 may be executed once. The erase loops may be repeated, for example, iteratively, or within a given number of times according to a sequence illustrated in FIG. 13A. Alternatively, as illustrated in FIG. 13B, erase loops LOOP1 and LOOP2 may be performed alternately. For example, the erase loop LOOP1 may be performed once, the erase loop LOOP2 may be performed once, the erase loop LOOP1 may be performed again, etc. In this example, the erase loops may be repeated a given number of times according to a sequence illustrated in FIG. 13B. Although a voltage setup period is not illustrated in FIGS. 13A and 13B, such a setup period may be executed prior to execution of an erase loop. In addition, an erase loop LOOP3 illustrated in FIG. 14 may be combined with the erase loops illustrated in FIGS. 10 and/or 12. Word lines WL0-WL31 may be driven with a voltage of about 0V during an erase execution period of an erase loop illustrated in FIG. 14. However, an erase operation including only the erase loop LOOP3 illustrated in FIG. 14 may not be sufficient.

Figure 15:
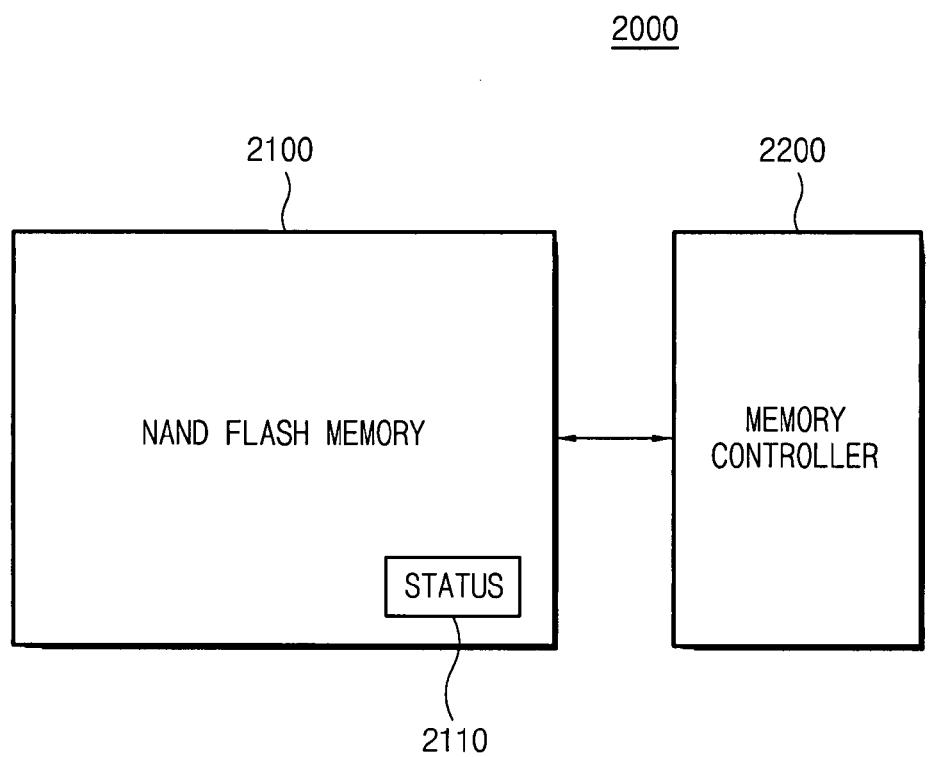
FIG. 15 is a block diagram showing a memory system according to an example embodiment.

FIG. 15 is a block diagram showing a memory system according to an example embodiment. Referring to FIG. 15, a memory system 2000 may include a NAND flash memory 2100 and a memory controller 2200. The NAND flash memory 2100 may be the same or substantially the same as the NAND flash memory 1000 illustrated in FIG. 9, and thus, a detailed description thereof has been omitted for the sake of brevity. When a block erase operation is determined or judged to fail, the memory system 2000 may be configured to determine whether the erase fail is due to memory cells connected to word lines WL0 and WL31, before processing a selected memory block as a bad or failure block. In at least this example embodiment, the memory controller 2200 may output a given command for a verify read operation to the NAND flash memory device 2100.

Figure 16A:
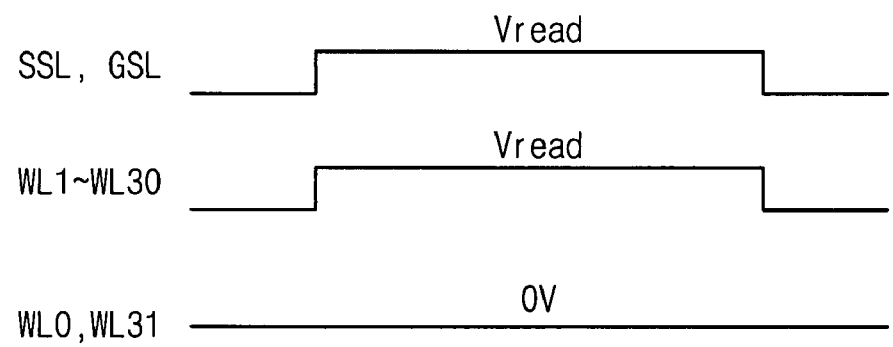
FIGS. 16A and 16B are timing diagrams for describing erase verify operations of a memory system illustrated in FIG. 15.
Figure 16B:
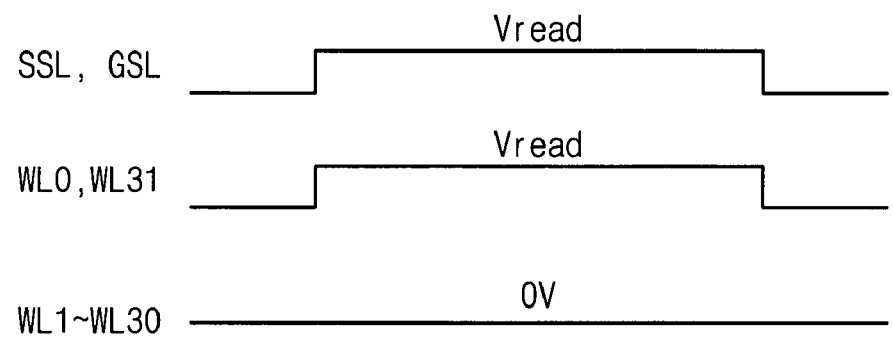

When a command for a verify read operation is received, the NAND flash memory device 2100 may perform a verify read operation (hereinafter, referred to as a first verify read operation) for determining whether memory cells connected to word lines WL1-WL30 are erased normally. The first verify read operation, as illustrated in FIG. 16A, may be performed by driving word lines WL0 and WL31 with a read voltage Vread and driving word lines WL1-WL30 with a voltage of about 0V. Data read by the first verify read operation may be determined by control logic 400 in the above-described manner, and the result may be stored in a status register 2110. After the first verify read operation is completed, the NAND flash memory device 2100 may perform another verify read operation (hereinafter, referred to as a second verify read operation) to determine (or alternatively judge) whether memory cells connected to the word lines WL0 and WL31 are erased normally. The second verify read operation, as illustrated in FIG. 16B, may be performed by driving the word lines WL0 and WL31 with a voltage of about 0V and driving the word lines WL1-WL30 with a read voltage Vread. Data read by the second verify read operation may be determined (or alternatively judged) by the control logic 400 in the above-described manner, and the result may be stored in the status register 2110.

After completing the first and second verify read operations, the memory controller 2200 may determine (or alternatively judge) whether the erase fail is due to memory cells connected to the word lines WL1-WL30 based on information stored in the status register 2110. If the erase fail is due to memory cells connected to the word lines WL1-WL30, the memory block may be treated as a bad or alternatively an error block.

If the erase fail is due to memory cells connected to the word lines WL0 and WL31, the memory controller 2200 may cause the NAND flash memory device 2100 to perform an erase operation for memory cells corresponding to the word lines WL0 and WL31. Erasure methods according to at least some example embodiments may suppress and/or minimize the treatment of a memory block as a bad (or alternatively an error) block due to memory cells connected to the word lines WL0 and WL31.

Although example embodiments have been described in connection with example embodiments illustrated in the accompanying drawings, it is not limited thereto. It will be apparent to those skilled in the art that various substitution, modifications and changes may be thereto without departing from the scope and spirit of the present invention.

What is claimed is:

1. A method of erasing a non-volatile memory device, the method comprising:
 simultaneously applying an electric field between each of a plurality of word lines and a substrate for a first time period, each of the plurality of word lines being connected to at least one memory cell of a memory block;

maintaining, after the first time period, the electric field applied between each word line in a first portion of the plurality of word lines and the substrate to erase a corresponding first portion of memory cells; and reducing or removing, after the first time period, the electric field between each word line in a second portion of the plurality of word lines and the substrate.

2. The method of claim 1, wherein at least during the maintaining and the reducing, a string select line and a ground select line are floated.

3. The method of claim 1, wherein the first portion of the plurality of word lines includes a first word line adjacent to a string select line and a second word line adjacent to a ground select line.

4. The method of claim 1, wherein the non-volatile memory device is a NAND flash memory device and the substrate has a triple well structure.

5. The method of claim 1, wherein the electric field between the second portion of the plurality of word lines and the substrate is removed by setting the second portion of the plurality of word lines to a floating state to prohibit erasing of memory cells connected to the second portion of the plurality of word lines.

6. The method of claim 1, wherein the electric field between the second portion of the plurality of word lines and the substrate is reduced by driving the second portion of the plurality of word lines with a voltage greater than or equal to a power supply voltage to prohibit erasing of memory cells connected to the second portion of the plurality of word lines.

7. The method of claim 1, wherein the simultaneously applying includes,
driving the plurality of word lines with a ground voltage, and
driving the substrate with an erase voltage.

8. A method of erasing a non-volatile memory device, the method comprising:
driving a plurality of word lines with a ground voltage and a well of a substrate with an erase voltage, while a string select line and a ground select line are floated, each of the plurality of word lines being connected to at least one of a plurality of memory cells in a memory block;
maintaining, after a first time period, the driving of a first portion of the plurality of word lines, the first portion of the plurality of word lines including a first word line adjacent to the string select line and a second word line adjacent to the ground select line; and
floating, after the first time period, a second portion of the plurality of word lines.

9. The method of claim 8, further including,
determining whether threshold voltages of memory cells connected to the plurality of word lines have reached a target threshold voltage, and
repeating the driving, maintaining and floating when a threshold voltage of at least one of the memory cells is greater than the target threshold voltage.

10. The method of claim 8, further including,
determining whether threshold voltages of memory cells connected to the plurality of word lines have reached a target threshold voltage, and
repeating the driving, maintaining, floating and determining if a threshold voltage of at least one of the memory cells is determined to be greater than the target threshold voltage, the first portion of the plurality of word lines including a first word line adjacent to the string select line and a second word line adjacent to the ground select line, wherein
the driving, maintaining, floating and determining are repeated until the threshold voltage of each of the memory cells is determined to be lower than the target threshold voltage.

11. A method of erasing a flash memory device, the method comprising:
repeating an erase loop operation for erasing memory cells, the erase loop operation including at least a first and a second erase loop, the first erase loop including,
driving a plurality of word lines with a ground voltage and a well of a substrate with an erase voltage, while a string select line and a ground select line are floated,
after a first time period, driving a first portion of the plurality of word lines with the ground voltage, while a remaining portion of the word lines are floated, the first portion of the plurality of word lines including a first word line adjacent to the string select line and a second word line adjacent to the ground select line; and
the second erase loop including,
driving the first portion of the plurality of word lines while the remaining portion of the word lines are floated.

12. The method of claim 11, wherein during an erase operation of each of the first and second erase loops, the string and ground select lines are maintained at a floating state.

13. A memory system comprising:
a flash memory device having a status register; and
a memory controller configured to control an erase operation of the flash memory device; wherein
after an erase operation of the flash memory device is complete, the memory controller is configured to output a command for a verify read operation to the flash memory device when status information in the status register indicates an erase fail; and
the flash memory device is configured to respond to the command by determining whether the erase fail is due to memory cells corresponding to a first portion of a plurality of word lines, the first portion including a first word line adjacent to a string select line and a second word line adjacent to a ground select line.

14. The memory system of claim 13, wherein the flash memory device is further configured to perform a first verify read operation and a second verify read operation, successively, in response to the received command, to determine whether the erase fail is due to memory cells corresponding to the first portion of the plurality of word lines.

15. The memory system of claim 14, wherein the first verify read operation includes,
driving the first portion of the plurality of word lines with a read voltage and driving a remaining portion of the word lines with a ground voltage.

16. The memory system of claim 14, wherein the second verify read operation includes,
driving the first portion of the plurality of word lines with the ground voltage, and
driving a remaining word lines with a read voltage.

17. The memory system of claim 14, wherein result values of the first and second verify read operations are stored in the status register.

18. The memory system of claim 17, wherein if the result values in the status register indicate that the erase fail is due to memory cells corresponding to the first portion of the plurality of word lines, the memory controller is configured to control the flash memory device to perform an erase operation with respect to memory cells corresponding to the first portion of the plurality of word lines.

19. The memory system of claim 18, wherein during the erase operation with respect to the memory cells corresponding to the first portion of the plurality of word lines, the first portion of the plurality of word lines are driven with the ground voltage and a remaining word lines are maintained at a floating state.

20. A method of erasing a flash memory device, the method comprising:

generating an erase voltage in response to an erase command;

first driving, for a first time period, a plurality of word lines with a ground voltage and driving a well of a substrate with an erase voltage, while floating string and ground select lines;

second driving, after the first time period elapses, a first portion of the plurality of word lines with the ground voltage and a second portion of the plurality of word lines with a voltage greater than or equal to a power supply voltage, the first portion of the plurality of word lines including a first word line adjacent to the string select line and a second word line adjacent to the ground select line;

determining whether threshold voltages of the memory cells have reached a target threshold voltage; and repeating at least the first driving, the second driving and the determining a number of times until the threshold voltage of each of the memory cells is lower than the target threshold voltage if a threshold voltage of at least one of the memory cells is determined to be greater than the target threshold voltage.

* * * * *